United States Patent
Zhao et al.

(10) Patent No.: US 10,263,593 B2
(45) Date of Patent: Apr. 16, 2019

(54) FILTER CIRCUIT IN RADIO FREQUENCY POWER DETECTION CIRCUIT

(71) Applicant: Beijing BBEF Science & Technology Co.,Ltd., Beijing (CN)

(72) Inventors: Liang Zhao, Beijing (CN); Zhenyu Yuan, Beijing (CN); Guangjian Li, Beijing (CN); Weize Li, Beijing (CN); Nianxi Xue, Beijing (CN)

(73) Assignee: Beijing BBEF Science & Technology Co.,Ltd., Beijing (CN)

( * ) Notice: Subject to any disclaimer, the term of this patent is extended or adjusted under 35 U.S.C. 154(b) by 7 days.

(21) Appl. No.: 15/684,951

(22) Filed: Aug. 24, 2017

(65) Prior Publication Data

US 2017/0353172 A1    Dec. 7, 2017

(30) Foreign Application Priority Data

Apr. 11, 2017   (CN) .......................... 2017 1 0232809

(51) Int. Cl.
*H03H 7/06* (2006.01)
*H03H 7/01* (2006.01)

(52) U.S. Cl.
CPC .............. *H03H 7/175* (2013.01); *H03H 7/06* (2013.01); *H03H 7/1775* (2013.01)

(58) Field of Classification Search
CPC ........ H03H 7/0115; H03H 7/06; H03H 7/175; H03H 7/1775
USPC .................................................... 333/172, 175
See application file for complete search history.

(56) References Cited

U.S. PATENT DOCUMENTS

| | | | | |
|---|---|---|---|---|
| 2011/0187449 | A1* | 8/2011 | Koechlin | H01P 1/20381 327/553 |
| 2015/0381163 | A1* | 12/2015 | Green | H03K 17/162 327/387 |

\* cited by examiner

*Primary Examiner* — Rakesh B Patel

(57) ABSTRACT

A filter circuit in a radio frequency power detection circuit includes input and output lines, wherein: an input terminal of the input and output lines is connected with a first capacitor, the first capacitor is connected with a first filtering sub-circuit; the first filtering sub-circuit is connected with a third capacitor, the third capacitor is connected with a second filtering sub-circuit; the second filtering sub-circuit is connected with an output terminal of the input and output lines. The filter circuit of the present invention is able to effectively improve the detection accuracy of the radio frequency electric source output power, thereby improving the power output accuracy of the radio frequency electric source.

9 Claims, 1 Drawing Sheet

FILTER CIRCUIT IN RADIO FREQUENCY POWER DETECTION CIRCUIT

CROSS REFERENCE OF RELATED APPLICATION

The present invention claims priority under 35 U.S.C. 119(a-d) to CN 201710232809.0, filed Apr. 11, 2017.

BACKGROUND OF THE PRESENT INVENTION

Field of Invention

The present invention relates to the electronic technology field, and more in particularly to a filter circuit in a RF (radio frequency) power detection circuit.

Description of Related Arts

The RF (radio frequency) power supply, as a plasma power supply, includes a RF power source, an impedance matcher and an impedance dynamometer. In the late eighties, it belongs to the emerging high-tech field in China. It is used in RF sputtering, PECVD, reactive ion etching and other equipment. Modern RF power supplies have been rapidly developed from the tube power supplies in the eighties to the modern transistor RF power supplies step by step. Accordingly, the power is developed from watts to 100 watts, kilowatts and megawatts; the frequency is developed from 2 MHz to 13.56 MHz, 27.12 MHz and 40.68 MHz; and applications from the previous vacuum field to other fields, such as semiconductors and beauty.

Take the existing 2 MHz RF power supply as an example, the operating frequency is in the range of 1.8 MHz-2.2 MHz, and the rated output power is 3 kW. The above power supply has problem as follows. The output power in the range of the operating frequency is low in accuracy and the lowest output power exceeds the rated output power by ±5%. The filter circuit in the RF power detection circuit adopts the band-pass filter to simulate and analyze the circuit (as shown in FIG. 1), for maintaining detection signals at three frequencies on a straight line as far as possible, but after measurements on the output power of the three frequencies, it still occurs that the output power of the intermediate frequency is higher than that of the frequencies at two ends. When the control voltage is set to DC10V, the output powers corresponding to three frequency points are respectively as follows. When the frequency is 1.8 MHz, the output power is 2970 W; when the frequency is 2 MHz, the output power is 3155 W; and when the frequency is 2.2 MHz, the output power is 2950 W. The output powers of the frequencies at two ends are within ±2% of the rated power, and the output power of the intermediate frequency exceeds the rated output power by ±5%. If the output power of the 2 MHz intermediate frequency is calibrated to within ±2% of the rated power, when the frequencies at two ends are 1.8 MHz and 2.2 MHz, the output powers thereof are respectively changed to 2830 W and 2810 W, both of which exceed the rated output power above ±5%. The output powers of the three frequencies are relatively larger in the accuracy difference, which affects the practicality, so that it is necessary to re-design the detection circuit for allowing the output powers within the range of the operating frequency to reach within ±2%.

SUMMARY OF THE PRESENT INVENTION

To overcome existing defects in prior arts, the present invention provides a re-designed RF (radio frequency) power filter circuit.

The present invention is achieved by technical solutions as follows.

A filter circuit in a RF power detection circuit comprises input and output lines, wherein: an input terminal of the input and output lines is connected with a first capacitor, the first capacitor is connected with a first filtering sub-circuit; the first filtering sub-circuit is connected with a third capacitor, the second capacitor is connected with a second filtering sub-circuit; the second filtering sub-circuit is connected with an output terminal of the input and output lines.

A further improvement is that: the first filtering sub-circuit comprises a first inductor and a second capacitor connected with the first inductor and the second filtering sub-circuit comprises a second inductor and a fourth capacitor connected with the second inductor.

A further improvement is that: an inductance of the first inductor of the first filtering sub-circuit is 4.5 μH and a capacitance of the second capacitor thereof is 1100 pF.

A further improvement is that: an inductance of the second inductor of the second filtering sub-circuit is 6.7 μH and a capacitance of the fourth capacitor thereof is 272 pF.

A further improvement is that: a capacitance of the first capacitor is 100 pF and a capacitance of the third capacitor is 745 pF.

A further improvement is that: the RF power filter circuit further comprises multiple resistors.

A further improvement is that: a first resistor is connected between the first capacitor and the first filtering sub-circuit in series, a second resistor is connected between the second filtering sub-circuit and an output terminal of the input and output lines in series, one end of a third resistor is connected with the output terminal of the input and output lines, and the other end of the third resistor is connected with ground.

A further improvement is that: a resistance of the first resistor is 100Ω, and a resistance of the second resistor and the third resistor is 2000Ω.

Compared with the prior arts, the present invention has advantages as follows.

The present invention greatly improves the accuracy of the RF electric source output power. Detect the improved electric source. When the frequency is 1.8 MHz, the output power is 2976 W which has a difference of 24 W from a rated output power; when the frequency is 2 MHz, the output power is 3012 W which has a difference of 12 W from the rated output power; when the frequency is 2.2 MHz, the output power is 3028 W which has a difference of 28 W from the rated output power. Through testing results, it can be seen that the output power accuracies at three frequency points are all controlled within ±2% of the rated output power. Therefore, the improved filter circuit plays a very obvious role in improving the output accuracy.

These and other objectives, features, and advantages of the present invention will become apparent from the following detailed description, the accompanying drawings, and the appended claims.

DETAILED DESCRIPTION OF THE PREFERRED EMBODIMENT

Embodiment 1

Figure 1:
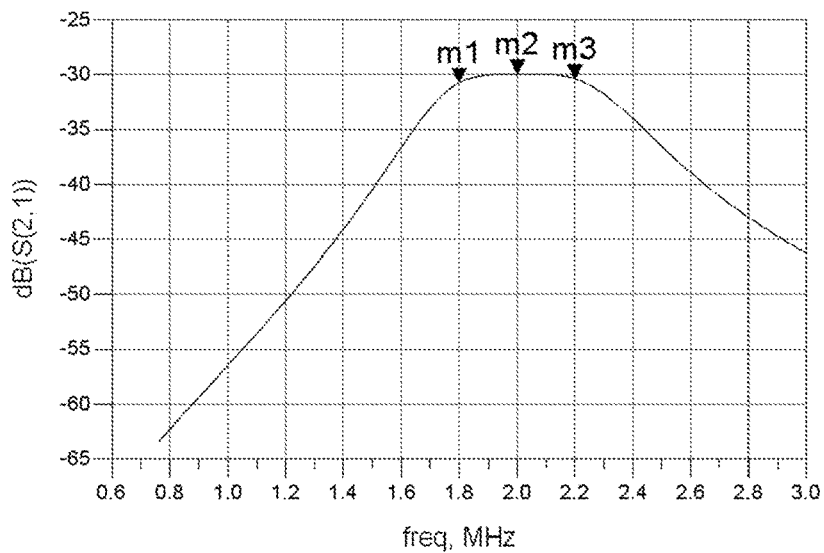
FIG. 1 is a change curve of an existing 2 MHz RF electric source output power.
Figure 2:
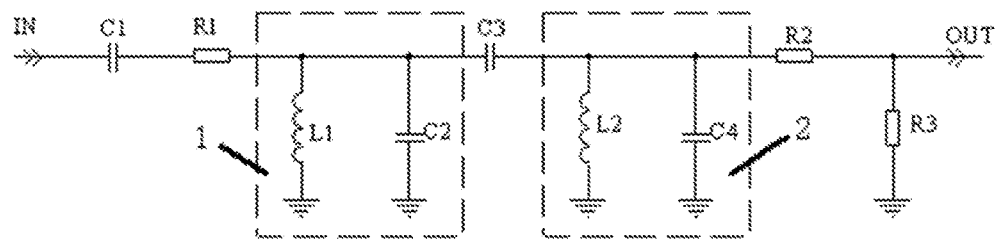
FIG. 2 is a circuit diagram of a filter circuit according to a preferred embodiment of the present invention.

FIG. 2 shows a 1.8 MHz-2.2 MHz RF (radio frequency) electric source filter circuit. In FIG. 2, C1 and C3 are adapted for allowing AC (alternating current) to pass through, isolating DC (direct current) and coupling. An inductor L1 and a capacitor C2 form a first filtering sub-circuit (which is labeled as reference number 1 in FIG. 2); an inductor L2 and a capacitor C4 form a second filtering sub-circuit (which is labeled as reference number 2 in FIG. 2); resistors R1, R2 and R3 are adapted for limiting current and dividing voltage.

The coupling amounts of the filtering sub-circuits in the detection circuit at the high, medium and low frequency points are different from each other, which causes the output power of the RF electric source is not balanced in the range of the operating frequency. A waveform of general LC filter circuits is that: a coupling amount of a center frequency is slightly higher than frequencies at both ends, which results in larger differences at high, medium and low frequency points. To equalize the coupling amounts at the three frequency points as far as possible, the coupling amount of the center frequency needs to be reduced, or the coupling amounts of the frequencies at both ends need to be increased.

The present invention adopts two groups of LC filter circuits connected with each other in series, so as to improve the problem that one group of LC filter circuit has the larger difference in the electric source output power at the lower frequency end and the higher frequency end.

However, if the two groups of LC filter circuits are directly connected with each other in series, the obtained waveform is as same as that obtained from one group of LC filter circuit, and the coupling amounts of the three frequency points have larger differences. Therefore, the key of the present invention lies in utilizing a medium coupling capacitor C3 which is adapted for connecting the two LC filter circuits in series, for finally increasing the output accuracy of the three frequency points from ±5% to ±2%.

In addition, the specifications of the components, the capacitance of the capacitors, the inductance of the inductors, the resistance of the resistors, etc. also need to cooperate with each other to achieve the best results. The inductance of the inductor L1 in the first filtering sub-circuit is 4.5 μH, a capacitance of the capacitor C2 is 1100 pF; the inductance of the inductor L2 in the second filtering sub-circuit is 6.7 μH, a capacitance of the capacitor C4 is 272 pF. The capacitance of C1 is 100 pF, the capacitance of C3 is 745 pF. The resistance of R1 is 100Ω, the resistance of R2 and R3 is 2000Ω.

Figure 3:
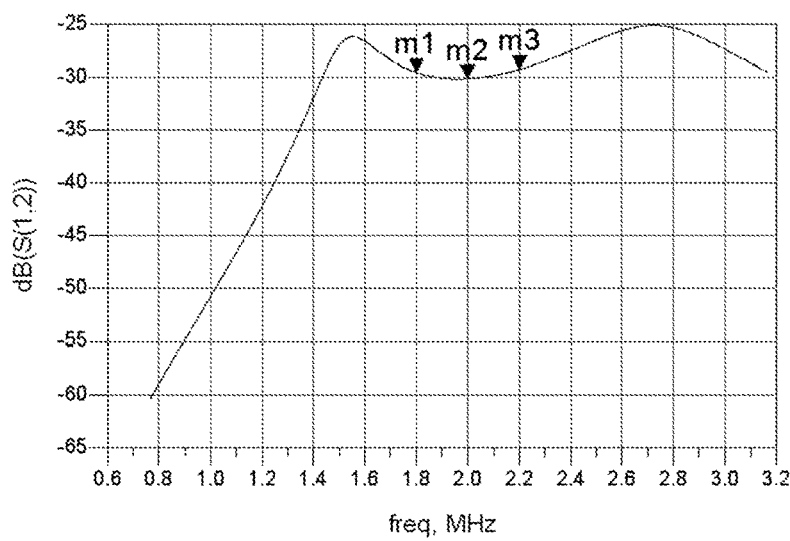
FIG. 3 is a change curve of an improved 2 MHz RF electric source output power according to the above preferred embodiment of the present invention.

Simulation results of this embodiment are shown in FIG. 3, which achieves the design purpose that the coupling amount of the intermediate frequency point is below the coupling amounts of the frequency points at two ends. In the practical testing, when the frequency is 1.8 MHz, the output power is 2976 W which has a difference of 24 W from a rated output power; when the frequency is 2 MHz, the output power is 3012 W which has a difference of 12 W from the rated output power; when the frequency is 2.2 MHz, the output power is 3028 W which has a difference of 28 W from the rated output power. Through testing results, it can be seen that the output power accuracies at three frequency points are all controlled within ±2% of the rated output power. Therefore, the improved filter circuit plays a very obvious role in improving the output accuracy.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A filter circuit in a RF (radio frequency) power detection circuit comprising: input and output lines, wherein:
    an input terminal of the input and output lines is connected with a first capacitor, the first capacitor is connected with a first filtering sub-circuit the first filtering sub-circuit is connected with a third capacitor, the third capacitor is connected with a second filtering sub-circuit the second filtering sub-circuit is connected with an output terminal of the input and output lines;
    a capacitance of the first capacitor is 100 pF and a capacitance of the third capacitor is 745 pF.

2. A filter circuit in a RF (radio frequency) power detection circuit comprising: input and output lines, wherein:
    an input terminal of the input and output lines is connected with a first capacitor, the first capacitor is connected with a first filtering sub-circuit the first filtering sub-circuit is connected with a third capacitor, the third capacitor is connected with a second filtering sub-circuit the second filtering sub-circuit is connected with an output terminal of the input and output lines;
    a first resistor is connected between the first capacitor and the first filtering sub-circuit in series, a second resistor is connected between the second filtering sub-circuit and an output terminal of the input and output lines in series, one end of a third resistor is connected with the output terminal of the input and output lines, and the other end of the third resistor is connected with ground.

3. The filter circuit in the RF power detection circuit, as recited in claim 2, wherein: a resistance of the first resistor is 100Ω, and a resistance of the second resistor and the third resistor is 2000Ω.

4. The filter circuit in the RF power detection circuit, as recited in claim 3, wherein: the first filtering sub-circuit comprises a first inductor and a second capacitor connected with the first inductor; and the second filtering sub-circuit comprises a second inductor and a fourth capacitor connected with the second inductor.

5. The filter circuit in the RF power detection circuit, as recited in claim 4, wherein: an inductance of the first inductor of the first filtering sub-circuit is 4.5 μH and a capacitance of the second capacitor thereof is 1100 pF.

6. The filter circuit in the RF power detection circuit, as recited in claim 5, wherein: an inductance of the second inductor of the second filtering sub-circuit is 6.7 μH and a capacitance of the fourth capacitor thereof is 272 pF.

7. The filter circuit in the RF power detection circuit, as recited in claim 2, wherein: the first filtering sub-circuit comprises a first inductor and a second capacitor connected with the first inductor; and the second filtering sub-circuit comprises a second inductor and a fourth capacitor connected with the second inductor.

8. The filter circuit in the RF power detection circuit, as recited in claim 7, wherein: an inductance of the first inductor of the first filtering sub-circuit is 4.5 µH and a capacitance of the second capacitor thereof is 1100 pF.

9. The filter circuit in the RF power detection circuit, as recited in claim 8, wherein: an inductance of the second inductor of the second filtering sub-circuit is 6.7 µH and a capacitance of the fourth capacitor thereof is 272 pF.

* * * * *